United States Patent [19]

Tokushige

[11] 4,259,729

[45] Mar. 31, 1981

[54] DYNAMIC MEMORY

[75] Inventor: Kazuo Tokushige, Tokyo, Japan

[73] Assignee: Nippon Electric Co., Ltd., Tokyo, Japan

[21] Appl. No.: 31,981

[22] Filed: Apr. 20, 1979

[30] Foreign Application Priority Data

Apr. 24, 1978 [JP] Japan .................................. 53-48544

[51] Int. Cl.³ .............................................. G11C 11/24
[52] U.S. Cl. .................................... 365/149; 365/226
[58] Field of Search ................................ 365/149, 226

[56] References Cited

U.S. PATENT DOCUMENTS

| 3,387,286 | 6/1968 | Dennard | 365/149 |
| 4,086,662 | 4/1978 | Itoh | 365/149 |
| 4,163,243 | 7/1979 | Kamins et al. | 365/149 |

OTHER PUBLICATIONS

Coe et al, Enter the 16,384-bit RAM, Electronics, 2/19/76, pp. 116-121.
Gray et al, Power Supply Stabilization Circuit, IBM Technical Disclosure Bulletin, vol. 21, No. 4, 9/78, pp. 1384-1385.
Boosntra et al., "A 4896-6 One-Transistor Per Bit Random-Access Memory with Internal Timing and Low Dissipation", *IEEE Journal of Solid State Circuits*, 10/73, pp. 305-310, vol. sc-8, No. 5.

*Primary Examiner*—Stuart N. Hecker
*Attorney, Agent, or Firm*—Fitzpatrick, Cella, Harper & Scinto

[57] ABSTRACT

A memory stable against variation of an external supply voltage is disclosed. The memory comprises a plurality of memory cells, each of memory cells including an insulated-gate field-effect transistor having a gate coupled to a word line, a source and a drain, one of the source and drain being coupled to a digit line, and an information storage capacitor having a first electrode coupled to the other of the source and drain of the transistor and a second electrode, and means for biasing the second electrode with a stabilized voltage.

11 Claims, 7 Drawing Figures

DYNAMIC MEMORY

The present invention relates to a dynamic memory, and more particularly, to a dynamic memory employing capacitors as information storage elements.

The so-called one-transistor-one-capacitor type dynamic memories employing capacitors as information storage elements have been widely utilized. In such type of memories, the capacitor takes the so-called MOS structure, that is a metal-insulator-semiconductor construction in which a capacitance is provided by a semiconductor substrate and a metal electrode opposed to the substrate via an insulator film, as disclosed, for example, in the article of "IEEE JOURNAL OF SO-LID-STATE CIRCUITS" Vol. SC-8, No.5, pp.305–310. In such a capacitor, a voltage of power source supplied from the exterior has been applied directly to the metal electrode, and consequently there has been a problem that if the supplied voltage should be subjected to variation, a state of an inversion layer formed in the surface portion of the substrate would be varied and hence the capacitance between the inversion layer and the metal electrode would be varied, so that malfunction may possibly occur upon read-out of the storage capacitor. In particular, while the electric charge stored in the capacitor is a product of the supplied voltage multiplied by the capacitance of the capacitor, if the supplied voltage is varied, then the variation of the electric charge is caused by the variation of the supplied voltage itself as well as the variation of the capacitance accompanying the former variation as superposed on each other. Consequently, a problem occurs in that upon read-out, malfunction may arise due to the variation of the stored electric charge. With regard to this problem, in the conventional memory device in the prior art in which a large margin in size was reserved upon working a pattern and a memory capacity in bit number was small, since the configuration of individual capacitors was chosen large in view of necessity for pattern working, the variation of the stored electric charge was compensated by a large capacitance, and the above-mentioned malfunction was not caused. Recently, however, as a memory device having a high memory capacity has been realized as a result of enchancement of working precision for a pattern, individual capacitors have become small-sized and their capacitance has also reduced, and hence the above-described problem of the errronous read-out has become unvoidable.

It is object of the present invention to provide a dynamic memory which can stably store information.

Another object of the present invention is to provide a dynamic memory in which storage of information can be achieved stably and a high memory capacity can be realized.

According to the present invention, a dynamic memory in which corred read-out can be achieved and an operation margin is large, is provided by forming a voltage stabilizer circuit in a semiconductor substrate in which memory cells are formed, connecting an external power supply to an input side of the voltage stabilizer circuit, and applying a stabilized voltage attained at an output terminal of the voltage stabilizer circuit to a gate outside electrode of an information storage capacitor.

In addition, according to the present invention, peripheral circuit such as a selection circuit, read/write control circuit, etc. are preferably supplied from power supply means in a separate system or supplied directly with a supplied voltage without the intermediary of the above-described voltage stabilizer circuit. It is only necessary to connect the gate (outside) electrodes of the capacitors in all the memory cells in common to the terminal of the aforementioned voltage stabilizer circuit.

Now the invention will be described in greater detail with reference to the accompanying drawings, in which.

In the followings, description will be made on the case where the representative MOS type field-effect transistors of metal-oxide-semiconductor structure (hereinafter abbreviated as MOSFET) are employed as one example of the insulated-gate field-effect transistors can be employed without being limited to the MOSFET.

Figure 1:
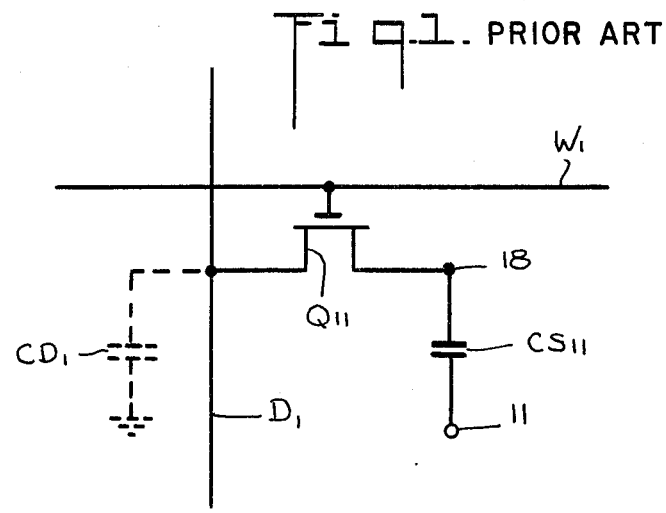
FIG. 1 is a circuit diagram showing a memory cell in a prior art dynamic memory.

A cell of such type of dynamic memory in the prior art is shown in FIG. 1. A word line W1 is connected to a gate terminal of a MOSFET Q11 and a bit or digit line D1 is connected to a source or drain terminal of the MOSFET Q11. A drain or source of the MOSFET Q11 is connected to a semiconductor side electrode of an information storage capacitor CS11 of metal-insulator-semiconductor structure (herinafter termed MOS structure), and a metal side electrode (hereinafter termed metal electrode) of the capacitor CS11 is connected to a power supply terminal 11. The metal electrode is made of conductive metal such as aluminum or silicon layer.

Figure 2:
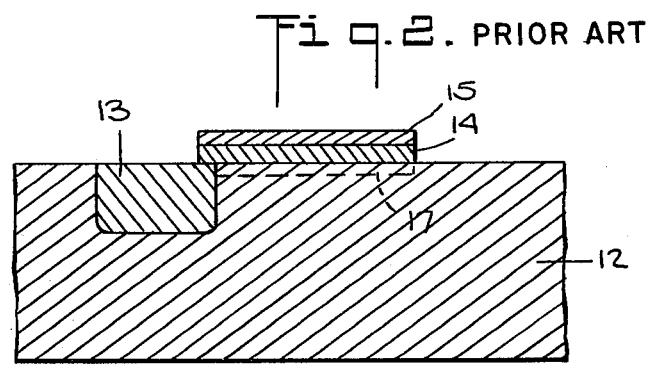
FIG. 2 is a cross-sectional view showing one structural example of an information storage capacity of MOS structure in the memory cell in FIG. 1.

The information storage capacitor CS11 may be fabricated for example as shown in FIG. 2. In a P-type semiconductor substrate 12 is formed an N-type diffused layer 13. An insulator film 14 is formed on the substrate 12 partly in contact with the diffused layer 13. A metal electrode 15 is formed on the insulator film 14 to form a MOS structure consisting of the metal 15-insulator film 14-semiconductor 12, and the electrostic capacitance between the substrate 12, especially an inversion layer 17 and the metal electrode 15 is realized to be used as an information storage capacitor. In this structure, the N-type region 13 is used as a lead-out section for the substrate side electrode, i.e. the inversion layer 17 of the capacitor, and generally it is also used in itself as a drain or source of the MOSFET Q11.

Figure 3:
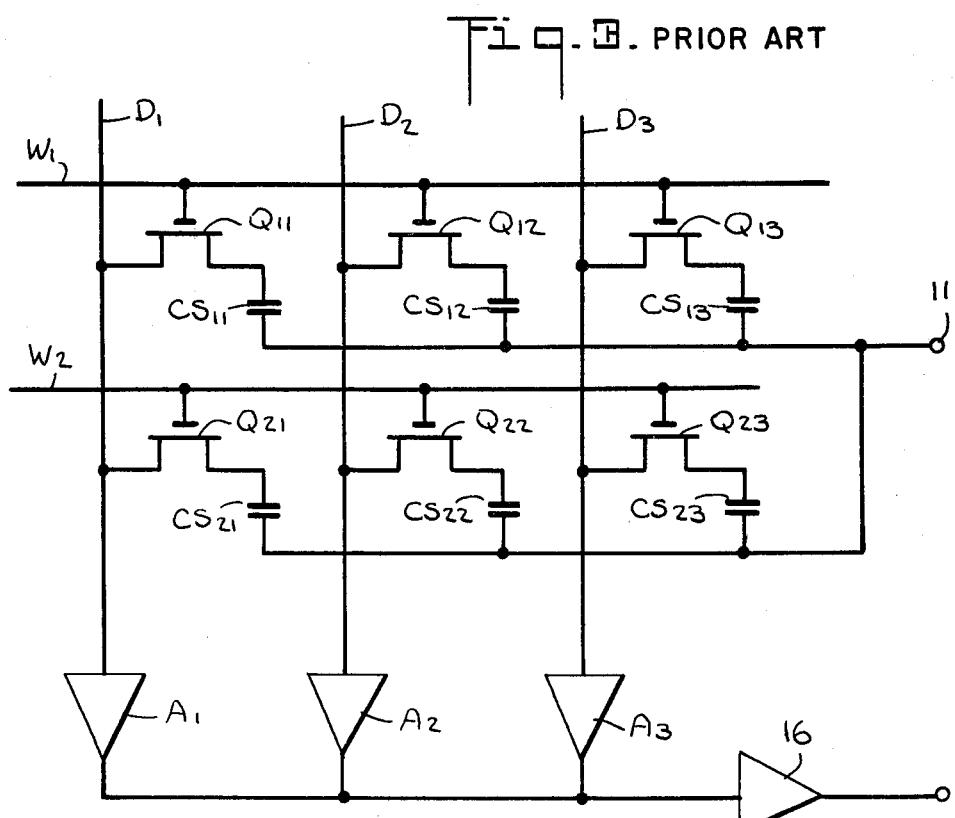
FIG. 3 is a circuit diagram partially showing a dynamic memory employing the memory cell illustrated in FIG. 1.

Memory cells as illustrated in FIG. 1 are arrayed in a matrix form as shown in FIG. 3 to form a memory device. More particularly, digit lines D1, D2, D3, . . . are provided in parallel to each other and at right angles to word lines W1, W2, . . . which are also provided in parallel to each other. Memory cells, that is a sets of an FET and a capacitor such as FET Q11 and capacitor CS11, FET Q12 and capacitor CS12, . . . are provided at the respective intersections of the word lines and the digit lines. One end of every digit line D1, D2, D3, . . . is coupled to a sense amplifier, A1, A2, A3, . . . , and outputs from these sense amplifiers are fed to a common sense amplifier 16. At least all the MOSFET's Qij and MOS capacitors CSij (i,j=1, 2, 3 . . . ) are formed in a semiconductor integrated circuit.

Operations of this memory are as follows. When a cell has been selected, for example, a word line W1 is brought to a potential for making an FET Q11 conducting. At this moment, if write is to be effected, a potential on a digit line D1 is set either at a low level or at a high level depending upon the information to be written, and the potential on the digit line D1 is transferred via the transistor Q11 to the MOS capacitor CS11. To the metal electrode 15 of the MOS capacitor CS11 is applied a voltage via a terminal 11 in such that an inversion layer 17 (FIG. 2) may be produced along the opposed surface of the semiconductor substrate 12. Thereafter, when the potential on the word line W1 is switched so as to make the FET Q11 non-conducting, the potential at a junction 18 between the FET Q11 and the capacitro CS11 or the semiconductor side electrode of the capacitor CS11, that is, the potential at the region 13 is retained by the information storage capacitor CS11.

In the case of effecting read-out, at first the digit line D1 is preliminarily charged up to a predetermined precharge level and then the FET Q11 is made conducting by changing the potential of the word line W1 to the high level. The potential on the digit line D1 after the FET Q11 has become conducting, is determined by the potential retained at the junction 18 and the voltage dividing ratio between the information storage capacitor CS11 and a capacitance DC1 of the digit line D1, and this potential on the digit line D1 is amplified by the sense amplifiers A1 and 16 and becomes available as an external output information. At this time, only the sense amplifier A1 connected to the selected digit line is selectively activated. In this memory device, since a leakage is caused through the substrate 12, the information stored in the capacitor CSij is periodically read out and the same read information is again written in the same read information is again written in the same capacitor, that is, the so-called refreshing is effected.

In the case where the aforementioned type of memory is realized in the form of a semiconductor integrated circuit, the circuit must be formed always with a margin of the order of for example, 5 $\mu$m in each pattern for the purpose of assuring reproducibility of the pattern, hence an electrode area of information storage capacitors becomes large, and thus the capacitance of the information storage capacitors is inevitably increased. However, in recent years, as a precision in a pattern working technique is widely improved and reproduction of a microfine pattern of the order of 1 $\mu$m has become possible, it has become possible to realize a memory capacity as large as 64 K bits to 256 K bits. Consequently, the area of the memory storage capacitors which had a large capacitance in the prior art, has been also remarkably reduced for the purpose of integrating the memory circuit in a limited chip area. As a result, the capacitance of the capacitors has been reduced. For example, in the case of a memory capacity of 4 K bits, the electrode area of the capacitor was formed to be as large as about 200 $\mu m^2$, whereas if the memory capacity is increased up to 64 K bits, it would be formed to be as small as about 50 $\mu m^2$.

On the other hand, as described above, it is necessary to apply a voltage to the metal electrode 15 of the information storage capacitor. Heretofore, since a power supply was directly connected to the metal electrodes of the information storage capacitors CSij, a variation of the power supply voltage was transmitted to the junction 18, and so, the written potential at this junction 18 was varied. However, as in the information storage capacitors in the prior art had a large capacitance, even if such variation existed, the read-out potential could be maintained substantially constant. But if the Capacitance of the information storage capacitors is reduced in inverse proportion to the increase of the integration density as is the case with the recent tendency, the influence of the above-mentioned variation in the power supply voltage cannot be overlooked, and hence disadvantages such as an error or reduction of an operation margin have occurred upon read-out operations. In this case, even if the vatiation in the power supply voltage should be in itself reduced to a sufficient extent, the lead wires from the power supply to the memory would be relatively long because the power supply is located at auexterior, and hence the variation in the voltage at the metal electrodes of the capacitors CSij caused by the inductance and resistance along the long lead wires could not be obviated. In addition, even if the aforementioned power supply voltage itself is simply stabilized within the same integrated circuit, the stabilized power supply voltage is supplied to the information storage capacitors as well as the peripheral circuits of the memory cells through relatively long lead wires, so that the lead wire for supplying the power supply voltage to the memory cells is influenced by the variation of the current supplied to the peripheral circuits due to voltage drops and induced voltages in the lead wire, and thus the potential at the metal electrodes of the information storage capacitors could not be substantially stabilized.

Figure 4:
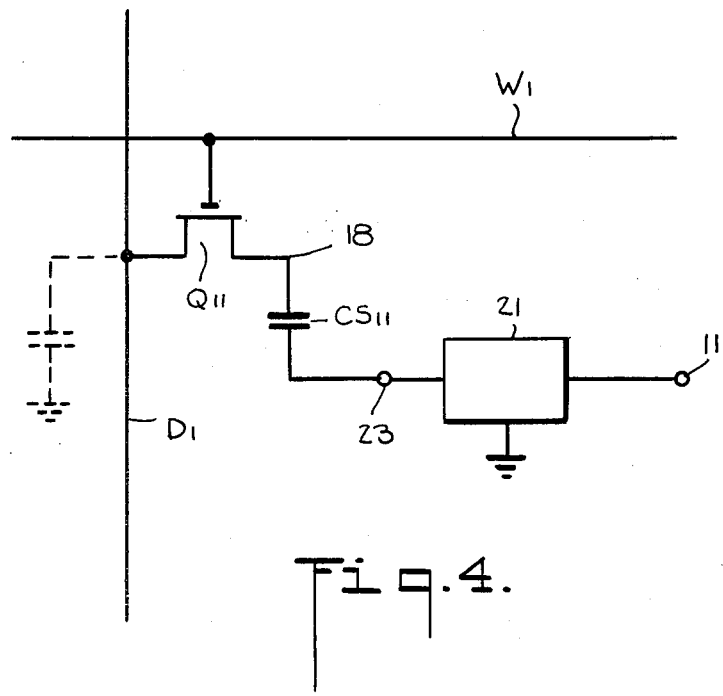
FIG. 4 is a circuit diagram showing a memory cell in a dynamic memory according to the present invention.

Now a memory device according to the present invention will be described with reference to FIG. 4, in which component parts equivalent to those illustrated in FIG. 1 are designated by like reference numerals. In this figure, means for stabilizing a power supply voltage, such as a voltage stabilizer circuit 21, is formed in the same semiconductor substrate in which an FET $Q_{11}$ and an information storage capacitor $CS_{11}$ and like FET's and capacitors are formed. The input side of the voltage stabilizer circuit 21 is connected to a power supply terminal 11, and the output terminal 23 of the circuit is connected to means for receiving a power supply voltage, such as the metal electrode of the capacitor $CS_{11}$. The power supply voltage is also supplied from the power supply terminal 11 directly to peripheral circuits such as a selection circuit, control circuit, etc. without the intermediary of the voltage stabilizer circuit 21. It is to be noted that the output voltage from the voltage stabilizer circuit 21 is applied not only to the capacitor $CS_{11}$ but also to the metal electrodes of the respective information storage capacitors CSij in common.

Figure 5:
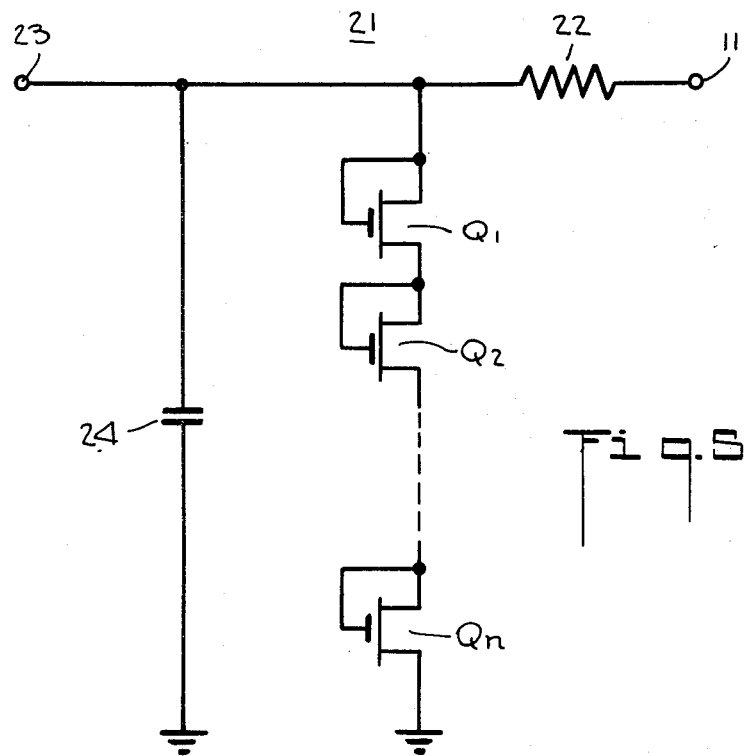
FIG. 5 and 6 are circuit diagrams respectively showing preferred embodiments of the voltage stabilizer circuit employed according to the present invention.

In the voltage stabilizer circuit 21, for instance as shown in FIG. 5, the power supply terminal 11 is coupled through a resistor 22 to a stabilized voltage output terminal 23, which output terminal is grounded at a reference voltage terminal through a series connection of diode-connected MOSFET's $Q_1 \sim Q_n$, and a capacitor 24 is connected in parallel to the series connection. The diode-connected MOSFETs present diode characteristics and have a constant voltage drop, and current dissipation therein is small. The number of the MOSFET's $Q_1 \sim Q_n$ is selected so that a desired voltage may appear at the output terminal 23, and by selecting the resistance value of the resistor 22 sufficiently high as compared to the series resistance of the series connection of the selected number of MOSFET's $Q_1 \sim Q_n$, a stabilized voltage can be obtained.

Figure 6:
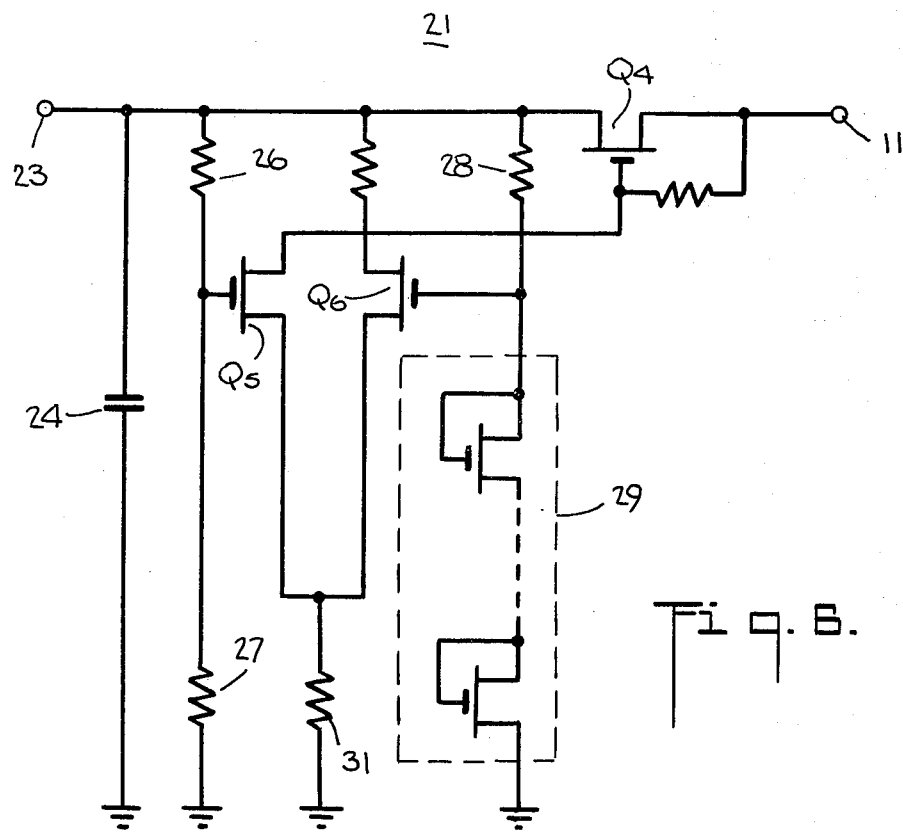

Alternatively, as shown in FIG. 6, a source-drain path of a MOSFET $Q_4$ is inserted between a power supply terminal 11 and a stabilized voltage output terminal 23, and a voltage at a junction between serially connected resistors 26 and 27 which are in turn connected between the output terminal 23 and the ground reference voltage terminal, is applied to a gate of a MOSFET $Q_5$. While, a voltage at a junction between a resistor 28 and a series circuit 29 of diode-connected MOSFET's which are in turn connected between the output terminal 23 and the ground, is applied to a gate of a MOSFET $Q_6$ as a reference voltage. The respective sources of the MOSFET's $Q_5$ and $Q_6$ are grounded through a common resistor 31, to compare a voltage at the gate of the MOSFET $Q_5$ which is correlated to the output voltage at the terminal 23 with the reference voltage at the gate of the MOSFET $Q_6$, and the comparison output is applied via the drain of the MOSFET $Q_5$ to the gate of the MOSFET $Q_4$ so that the output voltage at the output terminal 23 can be controlled to be constant.

Figure 7:
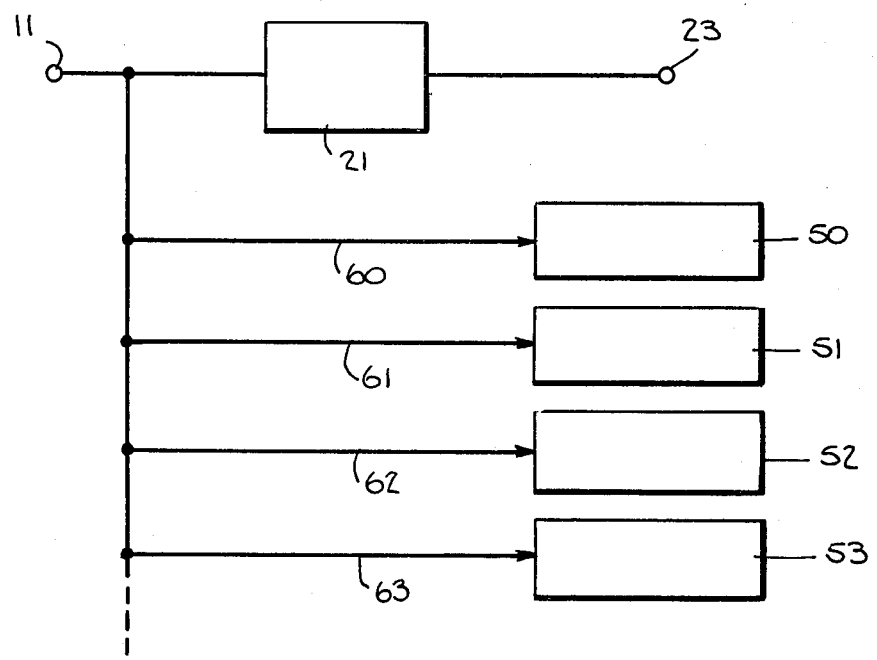
FIG. 7 is a block diagram showing the mode of supplying a power in the memory according to the present invention.

FIG. 7 shows the mode of supplying a power source according to the present invention, in which a voltage is applied from a power supply terminal 11 of an integrated circuit through a voltage stabilizer circuit 21 to the metal terminal 15 of the information storage capacitor (not shown in this figure) as described above, but the supply of a power to a memory cell selection circuit 50, read/write control circuit 51, output circuit 52 and timing signal generator circuit 53 in the memory device is achieved respectively through separate power supply lines 60 63 connected to the power supply terminal 11 without the intermediary of the voltage stabilizer circuit 21. By supplying the stabilized output voltage from the voltage stabilizer circuit 21 solely to the metal electrodes of the information storage capacitors in the memory in the above-described manner, the influences such as noises or the like applied to the information storage capacitors from the peripheral circuits via power supply lines can be reduced to minimum, and thereby the effects of the present invention are made more excellent and more remarkable.

Now description will be made on the effects and advantages of the present invention with reference to FIG. 1. The occurrence of malfunction in a read-out operation due to voltage variation at the metal electrode terminal 11 of the capacitor $CS_{11}$ as described previously, is limited to the case where the memory cell stores a low level of information, that is, where the substrate side electrode 18 of the capacitor $CS_{11}$ is held at a low level. It is assumed that the precharge voltage on the digit line $D_1$ is represented by $V_M$ and the voltage at the electrode 18 when the cell is at a low level state is represented by $V_L$. Similarly, the capacitance of the digit line $D_1$ is represented by $C_D$, and the capacitance of the capacitor $CS_{11}$ in the cell is represented by $C_S$. The a voltage change $\Delta V_D$ on the digit line $D_1$ when this memory cell has been selected and read out, that is, a read-out voltage $\Delta V_D$ is represented by the following equation:

$$\Delta V_D = (C_S/C_D + C_S) \cdot V_M - (C_S/C_D + C_S) \cdot V_L \quad (1)$$

Assuming now that the power supply voltage $V_{DD}$ applied to the metal electrode 11 of the capacitor $CS_{11}$ is 5 V, and a guaranteed value for the power supply voltage variation required for the memory circuit is $\pm 10\%$, then the voltage $V_{DD}$ will be varied within the range of 4.5 V having an amplitude of 1V. Taking into consideration the stray capacitance between the substrate side electrode 18 of the capacitor $CS_{11}$ and the substrate, about 90% of the variation of the voltage $V_{DD}$ applied to the terminal 11 of the capacitor $CS_{11}$ is transmitted to the gate electrode 18 of the MOSFET $Q_{11}$. Accordingly, if the variation width of the voltage $V_{DD}$ is 1 V, then the voltage $V_L$ will vary within a variation width of 0.9 V. Here, if it is desired that even if the supply voltage $V_{DD}$ should be varied from 4.5 V to 5.5 V upon read-out operation, the same read-out voltage $\Delta V_D$ as that in the case of no variation of the voltage $V_{DD}$ may be guaranteed, then the following equation is derived from Equation (1) above:

$$\Delta V_D = \frac{C_S'}{C_D + C_S'} \cdot V_M - \frac{C_S'}{C_D + C_S'} \cdot (V_L + 0.9) \quad (2)$$
$$= \frac{C_S}{C_D + C_S} \cdot V_M - \frac{C_S}{C_D + C_S} \cdot V_L$$

where $C_S'$ represents the capacitance of the capacitor $CS_{11}$ in the desired case. Since the read-out in question is a read-out operation for a lower level, it can be assumed that $V_L = 0$ V and the voltage $V_M$ takes a common precharge level which is a level lower than the supply voltage $V_{DD}$ by a threshold value $V_T$ of a single stage MOSFET. Then the voltage $V_M$ is represented by the following equation:

$$V_M = \frac{1}{1+\alpha}(V_{DD} - V_T)$$

where $\alpha$ represents a body effect constant that is defined as a ratio of a threshold voltage variation to a substrate potential variation, and in a general MOS integrated circuit it is approximately equal to 0.03. Sustituting the practical values $\alpha = 0.03$, $V_T = 0.8$, and $V_{DD} = 5.5$ V in the above equation, we obtain $V_M = 4.56$ V.

Accordingly, if the nominal values $V_M = 4.56$ V and $V_L = 0$ V are substituted in Equation (2) above to calculate the ratio $C_S'/C_S$ of the capacitance $C_S'$ of the capacitor $CS_{11}$ which is increased for the purpose of compensating for a supply voltage variation to the original capacitance $C_S$ of the capacitor $CS_{11}$ having no compensation capability, then the following equation can be obtained:

$$C_S'/C_S = 1.246 + 0.246 \, C_S'/C_D \quad (3)$$

As will be seen from Equation (3) above, in the case where the supply voltage variation is compensated by increasing the capacitance $C_S$ of the capacitor $CS_{11}$, at least 24% increase of the capacitance $C_S$ is required as compared to the case where the gate electrode voltage itself of the capacitor $CS_{11}$ is stabilized as is the case with the present invention. Thus when the capacitor $CS_{11}$ is constructed by same structure, at least 24% increase of the electrode area of the capacitor is necessitated, and hence it becomes difficult to construct an integrated memory circuit having a very high integration density. For instance, if a common value for $C_S'/C_D$ of 0.26 is adopted, the ratio $C_S'/C_S$ will amount to 1.3, and therefore, in the case of not stabilizing the metal electrode voltage of the capacitor, a capacitor having an electrode area 30% larger than that in the memory according to the present invention is necessitated.

As described above, according to the present invention, since a voltage stabilizer circuit 21 is provided in the same semiconductor substrate in which memory cells are formed, a constant voltage is applied to metal electrodes of information storage capacitors, so that stored information can be read out correctly and an operation margin is also increased.

Owing to the use of the voltage stabilizer circuit 21 according to the present invention, sometimes the voltage supplied to the information storage capacitor $CS_{11}$ is slightly lowered and thus the inversion layer may not be produced depending upon the write potential. In such cases, if the threshold value of the MOS structure in the information storage capacitor $CS_{11}$, that is the threshold voltage between the metal electrode 15 and the region 13 is lowered so as to compensate for the voltage drop introduced by the voltage stabilizer circuit 21 (generally of the order of about 2 V), then there would occur no trouble in operation.

I claim:

1. A memory comprising a plurality of word lines, a plurality of bit lines, a plurality of memory cells, each of said memory cells including an insulated-gate field-effect transistor having a gate coupled to one of said word lines, a source and a drain, said drain being coupled to one of said bit lines, and a capacitor having a first electrode coupled to said source of said transistor and a second electrode, means for receiving a power supply voltage, means for stabilizing said power supply voltage to produce a stabilized voltage substantially free from variation in said power supply voltage, and means for supplying in common the second electrodes of said capacitors in said memory cells with said stabilized voltage.

2. A semiconductor integrated circuit comprising a semiconductor substrate, a plurality of word lines formed on said substrate, a plurality of bit lines formed on said substrate, a plurality of memory cells, each of said memory cells including an insulated-gate field-effect transistor formed on said substrate and having a gate coupled to an associated one of said word lines, a source and a drain, said source being coupled to an associated one of said bit lines and a capacitor means formed on said substrate and having a first electrode coupled to said source and a second electrode, a power supply terminal for receiving a power supply voltage from the exterior, and stabilizer means formed on said substrate for stabilizing said power supply voltage to produce a stabilized voltage having a constant value substantially free of variation of said power supply voltage and means for supplying said stabilized voltage to said second electrodes.

3. The circuit according to claim 2, wherein said first electrode is formed of a semiconductor region at the surface of said substrate and said second electrode is made of a conductive layer formed above the surface of said substrate.

4. A circuit according to claim 2, further comprising a selection circuit for selecting said memory cells and means for directly supplying said power supply voltage to said selection circuit.

5. A circuit according to claim 4, further comprising a timing signal generator for producing a timing signal and means for directly supplying said power supply voltage to said timing signal generator.

6. A circuit according to claim 5, further comprising means for receiving a common voltage for comparing said stabilized voltage and said power supply voltage.

7. A circuit according to claim 5, in which said power supply voltage and said stabilized voltage are capable of making said insulated-gate field-effect transistor conduct.

8. A circuit according to claim 2, in which said stabilizer means includes a plurality of serially connected insulated-gate field-effect transistors having their respective gates connected to their respective drains.

9. A memory comprising a plurality of word lines, a plurality of bit lines, a plurality of memory cells, each of said memory cells including a capacitor having an electrode and a transfer gate having a control electrode coupled to one of said word lines, an electric charge being selectively transferred between said capacitor and one of said digit line through said transfer gate, means for receiving a power supply voltage, stabilizer means for stabilizing said power supply voltage to produce a stabilized voltage substantially free from variation in said power supply voltage, and means for supplying in common said electrodes of said capacitors in said memory cells with said stabilized voltage.

10. A memory according to claim 9, in which said stabilizer means includes an output terminal, a reference voltage terminal, a series circuit having a plurality of serially connected insulated-gate field-effect transistors coupled between said output terminal and said reference voltage terminal, each of said serially connected transistors having its gate coupled to its drain, and a capacitor inserted between said output terminal and said reference voltage terminal.

11. A memory according to claim 9, in which said stabilizer means includes a power supply terminal; an output terminal; a reference voltage terminal; a first insulated-gate field-effect transistor having a source, drain and gate, and being connected with its source-drain path inserted between the power supply terminal and the output terminal; first resistor means connected between the power supply terminal and the gate of the first transistor; second resistor means being connected at one end to the reference voltage terminal; a second insulated-gate field-effect transistor having a source, drain and gate, and being connected with its source-drain path inserted between the gate of the first transistor and the other end of the second resistor means; a third insulated-gate field-effect transistor having a source, drain and gate, and being connected with its source-drain path inserted between the output terminal and the other end of the second resistor means; third resistor means connected between the output terminal and the gate of the second transistor; fourth resistor means connected between the gate of the second transistor and the reference voltage terminal; fifth resistor means connected between the output terminal and the gate of the third transistor; and a plurality of diode-connected insulated-gate field-effect transistors connected with their source-drain paths in series between the gate of the third transistor and the reference voltage terminal.

* * * * *

UNITED STATES PATENT AND TRADEMARK OFFICE
CERTIFICATE OF CORRECTION

PATENT NO. : 4,259,729

DATED : March 31, 1981

INVENTOR(S) : Kazuo Tokushige

It is certified that error appears in the above—identified patent and that said Letters Patent is hereby corrected as shown below:

Column 3, line 35, "DC1" should read -- CD1 --.

Column 6, line 8, after "4.5" insert -- 5.5 --.

Signed and Sealed this

Fourth Day of August 1981

[SEAL]

Attest:

GERALD J. MOSSINGHOFF

Attesting Officer   Commissioner of Patents and Trademarks